United States Patent [19]
Feinberg et al.

[11] Patent Number: 5,561,369
[45] Date of Patent: Oct. 1, 1996

[54] VARIATION OF NUMBER AND DURATION OF GRADIENT READ TIMES DURING A SINGLE PULSE SEQUENCE FOR PROTON DENSITY AND $T_2$-WEIGHTED IMAGES

[76] Inventors: David A. Feinberg, 333 E. 30th St., New York, N.Y. 10016; Berthold Kiefer, Pechmannstrasse 30, D 91058 Erlangen, Germany

[21] Appl. No.: 282,344

[22] Filed: Jul. 29, 1994

[51] Int. Cl.⁶ .................................................. G01V 3/00
[52] U.S. Cl. ........................................ 324/307; 324/311
[58] Field of Search .................................... 324/307, 309, 324/310, 311, 314, 300

[56] References Cited

U.S. PATENT DOCUMENTS 5,369,362  11/1994  Counsell ................................. 324/307
5,459,400  10/1995  Moonen ................................. 324/307

*Primary Examiner*—Louis M. Arana
*Attorney, Agent, or Firm*—Mark H. Jay

[57] ABSTRACT

The gradient read time is varied during the course of a single pulse sequence in which both proton density weighted image data and $T_2$-weighted image data are collected. The number of gradient refocussings after each RF refocussing pulse in a gradient spin echo pulse sequence is changed during the course of the pulse sequence.

8 Claims, 3 Drawing Sheets

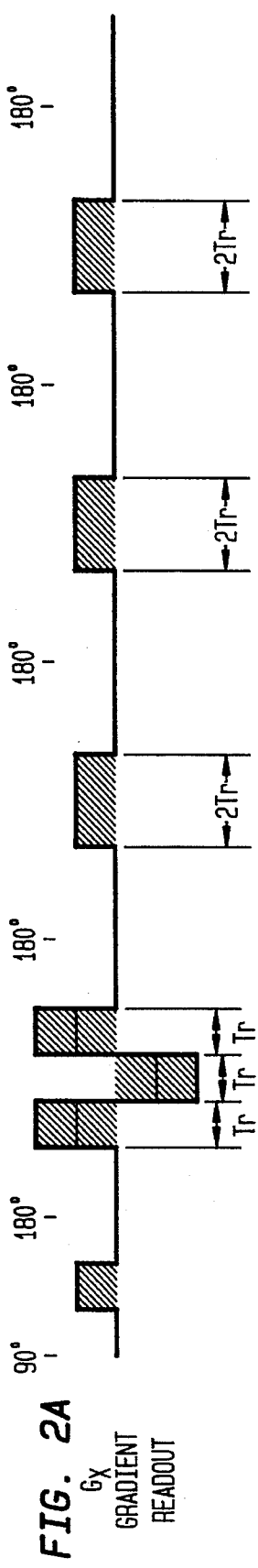
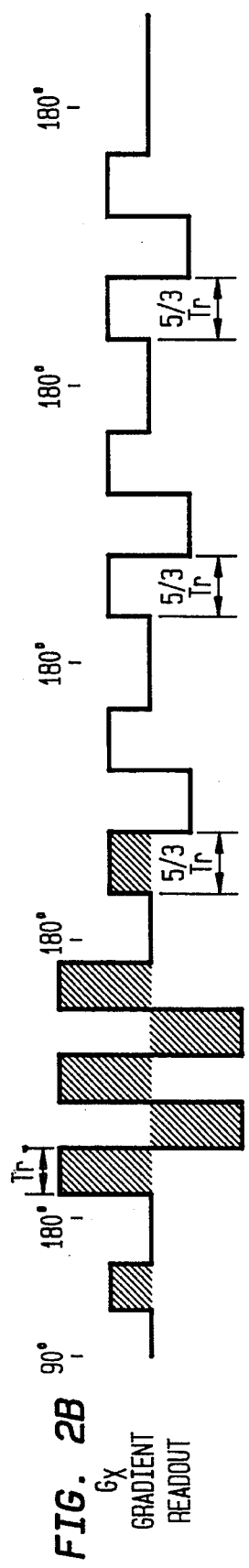
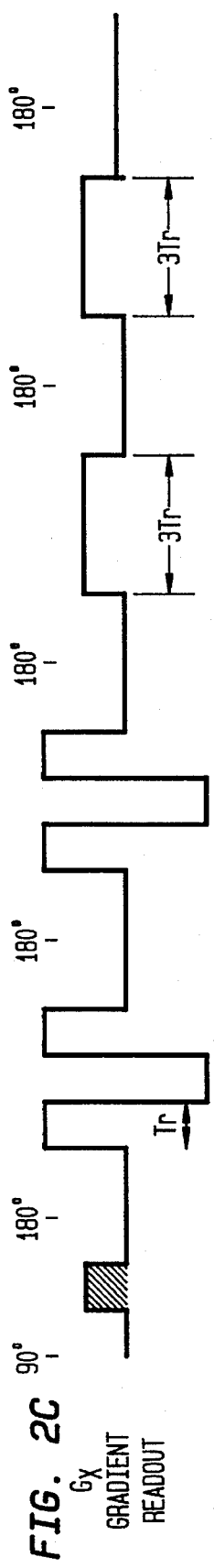
FIG. 2A
FIG. 2B
FIG. 2C

VARIATION OF NUMBER AND DURATION OF GRADIENT READ TIMES DURING A SINGLE PULSE SEQUENCE FOR PROTON DENSITY AND T₂-WEIGHTED IMAGES

BACKGROUND OF THE INVENTION

The invention relates to magnetic resonance imaging, and more particularly relates to pulse sequences used in magnetic resonance imaging. In its most immediate sense, the invention relates to pulse sequences for acquisition of proton density weighted images and $T_2$-weighted images.

In spin echo and gradient spin echo sequences, the amplitude of the echo signal(s) which follow each refocussing pulse progressively decreases with time as a result of spin-spin ($T_2$) relaxation. As a result, the signal-to-noise ratio of the (gradient) spin echo signals progressively deteriorates.

This phenomenon has disadvantageous consequences when, as is common in clinical practice, a single pulse sequence is used to acquire data to reconstruct a proton density weighted image and a $T_2$-weighted image. The proton density weighted image data is acquired at the beginning of the sequence, commencing after the first 180° RF refocussing pulse. During this acquisition, the amplitude of the echo signal is at a maximum and the signal-to-noise ratio is therefore high. The $T_2$-weighted image data, on the other hand, are acquired later on, when the amplitude of the echo signal is lower. Therefore, the signal-to-noise ratio of the $T_2$-weighted image data is poorer than that of the proton density weighted image data. As a result, the $T_2$-weighted image is noisier than the proton density weighted image.

It would be advantageous to improve the quality of a $T_2$-weighted image which is produced during the same pulse sequence as a proton weighted image.

In accordance with the invention, the gradient read time is varied during the course of a single pulse sequence in which both proton weighted image data and $T_2$-weighted image data are collected. In accordance with the preferred embodiment, the gradient read time used to collect the $T_2$-weighted image data is longer than the gradient read time used to collect the proton density weighted image data. This may be accomplished by increasing the gradient read time at each phase-encoding gradient and by acquiring a larger number of $T_2$-weighted signals and averaging them.

By using a longer gradient read time during collection of $T_2$-weighted image data, the bandwidth of this data is narrowed and the signal-to-noise ratio of the data is correspondingly improved. This compensates for the intrinsically poorer signal-to-noise ratio of the echo signal and makes the signal-to-noise ratio of the T2-weighted image comparable to the signal-to-noise ratio of the proton density weighted image.

In accordance with another aspect of the invention, the number of gradient refocussings after each RF refocussing pulse in a gradient spin echo pulse sequence is changed during the course of the pulse sequence. This makes it possible to acquire the necessary proton density weighted image data and the T2-weighted image data more rapidly than in conventional spin echo imaging.

In preferred embodiments, the gradient read time can be varied not only by changing the duration of gradient read-out at a particular phase-encoding gradient but also by changing the number of echo signals which are read out after the appropriate RF refocussing pulses, i.e. by changing the number of gradient refocussings. It is also possible to use a mixed-type pulse sequence in which e.g. the proton density weighted image data is acquired using multiple gradient refocussings while the $T_2$-weighted image data is acquired at a read-out gradient which remains constant between one RF refocussing pulse and the next one.

BRIEF DESCRIPTION OF THE DRAWINGS

The invention will be better understood with reference to the following illustrative and non-limiting drawings, in which:

FIGS. 2A–2E show pulse sequences in accordance with preferred embodiments of the invention.

DETAILED DESCRIPTION OF PREFERRED EMBODIMENTS

The following description does not describe conventional magnetic resonance imaging equipment; such equipment is known to persons skilled in the art. Furthermore, the following description does not describe the manner in which the read-out gradient is varied during the pulse sequence. There are various schemes for so varying the read-out gradient; these schemes are application-specific. The following description assumes general familiarity with pulse sequences used in conventional MRI equipment and focusses upon the time during which the induced magnetic resonance echo signal is read out. Where a spin echo sequence is used, the induced signals will be spin-echo signals; where a gradient spin echo sequence is used, the induced signals will be in groups wherein the middle signal is a spin-echo signal and the other signals are otherwise. Because the invention can be used with spin echo pulse sequences, gradient spin echo pulse sequences and even sequences which have characteristics of both types, the description herein refers generically to "echo" signals at certain locations to avoid unnecessary confusion.

Figure 1:
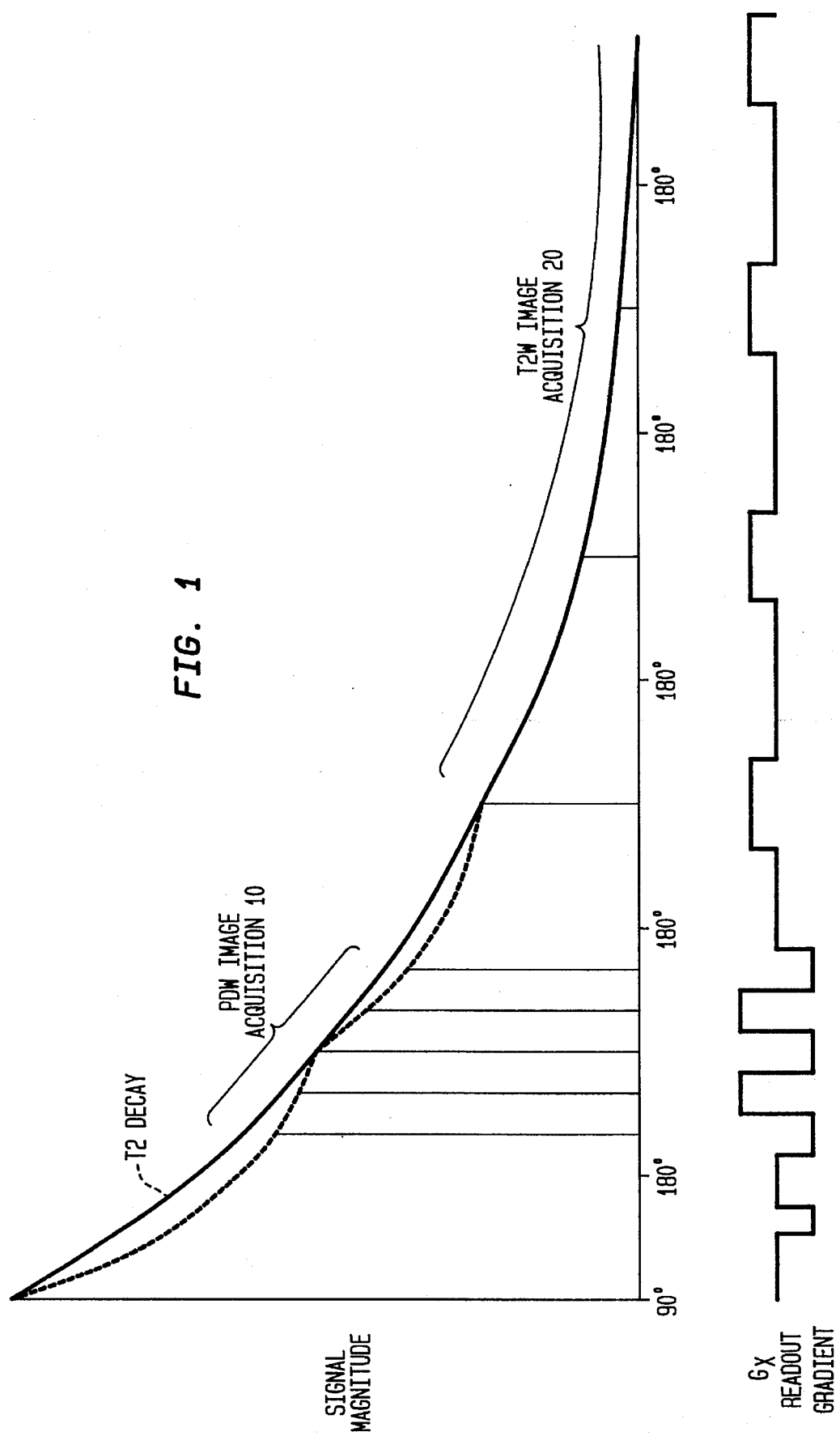
FIG. 1 shows how the amplitude of an echo signal progressively decreases after successive RF refocussing pulses as a result of spin-spin relaxation, and also shows the portions of the echo signal from which T2-weighted image data and proton density weighted image data are drawn using conventional techniques.

FIG. 1 schematically shows a plurality of 180° RF pulses (also known as RF refocussing pulses) which follow an initial 90° RF pulse. When the induced MR echo signals are read out after the RF refocussing pulses, the amplitude of the induced MR signals progressively decreases. This is also shown in FIG. 1.

Where (as in conventional spin echo imaging and dual-contrast spin echo train imaging) a single pulse sequence is used to acquire data for a proton density weighted image and a T2-weighted image, the data for the proton density weighted image are acquired first and the data for the T2-weighted image are acquired later. As shown in FIG. 1, the proton density weighted image data is acquired during time interval 10 between the first and second RF refocussing pulses, but this is not necessary; data collection for the proton density weighted image may continue between e.g. the second and third RF refocussing pulses.

Some time later, there occurs data collection for the T2-weighted image. As shown, collection of this data during time interval 20 commences after the second RF refocussing pulse, but this is not required; it is only necessary that such data collection commence after collection of T2-weighted image data has ceased. Collection of T2-weighted image data continues until the end of the pulse sequence, where-upon the pulse sequence is repeated and the next line of data is read out.

As is evident from FIG. 1, the amplitude of the echo signal is highest at the beginning of the pulse sequence and progressively diminishes as the sequence continues. Therefore, the signal-to-noise ratio of this signal is highest at the beginning of the sequence and lower afterward. Thus, using conventional techniques, the T2-weighted image is of poorer quality than the proton density weighted image.

In conventional MR pulse sequences, the length of the time interval during which the echo signal is read out at a particular read-out gradient (the "gradient read time") is kept constant. Furthermore, the same number of echo signals are read out after each RF refocussing pulse, i.e. the number of gradient refocussings remains constant during the pulse sequence. In accordance with the invention, the duration and/or number of the read-out intervals is changed within the pulse sequence. In accordance with the preferred embodiment, the gradient read time is increased during data acquisition for the T2-weighted image. This narrows the bandwidth and correspondingly raises the signal-to-noise ratio of the resulting T2-weighted image.

In accordance with another aspect of the invention, the number of gradient refocussings following each RF refocussing pulse in a gradient spin echo sequence is varied during the sequence.

Pulse sequences in accordance with the preferred embodiment of the invention are shown in FIGS. 2A–2E, it being understood that the actual read-out gradients used are not shown and are not part of the invention.

In FIG. 2A, the proton density weighted image data are acquired between the first and second RF refocussing pulses; in this example, the echo signal is read out three times using three read-out gradients which alternate in polarity, i.e. there are three gradient refocussings. Thereafter, between the second and third RF refocussing pulses and until the end of the sequence, T2-weighted image data are acquired. During this period, only one spin echo signal is read out between successive RF refocussing pulses, and the gradient read time during which the spin echo signal is read out equals two thirds of the total gradient read time during the three read-out gradients between the first and second RF refocussing pulses. The gradient read time after the second and subsequent RF refocussing pulses is greater than the gradient read time during each of the three gradients between the first and second RF refocussing pulses.

In FIG. 2B, there is shown a gradient spin echo pulse sequence wherein there are five gradient refocussings, i.e. read outs of five echos between the first and second RF refocussing pulses (this is when the proton density weighted image data is acquired) and three gradient refocussings between all the other pairs of RF refocussing pulses (when the T2-weighted image data is read out). The total gradient read time between each pair of RF refocussing pulses is the same, but the gradient read time during acquisition of proton density weighted image data is shorter than during acquisition of T2-weighted image data.

In FIG. 2C, the proton density weighted image data are read out not only between the first and second RF refocussing pulses but also between the second and third RF refocussing pulses. During this time, three echos are read out at different read-out gradients between each pair of RF refocussing pulses, i.e. there are three gradient refocussings between each pair of RF refocussing pulses. Thereafter, a spin echo is read out between each pair of RF refocussing pulses until the end of the sequence; this latter data is used for the T2-weighted image. In this embodiment, the total gradient read time between each two successive RF refocussing pulses is constant, but the gradient read time during each read-out of a spin echo signal is three times as long as the gradient read time during acquisition of proton density weighted image data.

Figure 2D:
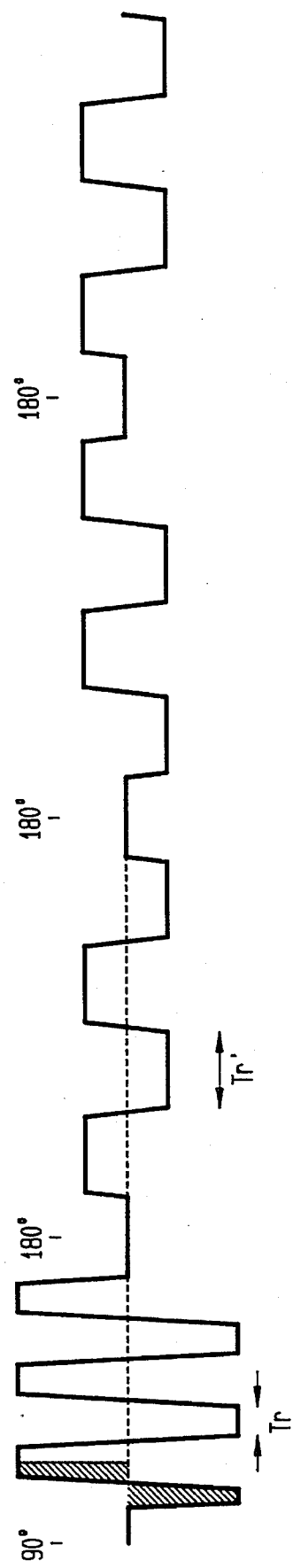

In FIG. 2D proton density weighted image data are acquired between the first and second RF refocussing pulses and T2-weighted image data are acquired after the second RF refocussing pulse. There are six gradient refocussings between the first and second RF refocussing pulses and nine gradient refocussings between the second and third RF refocussing pulses, and the gradient read time between the first and second RF refocussing pulses is shorter than the gradient read time between the second and the third RF refocussing pulses. In this example, the three RF refocussing pulses are not evenly spaced apart.

Figure 2E:
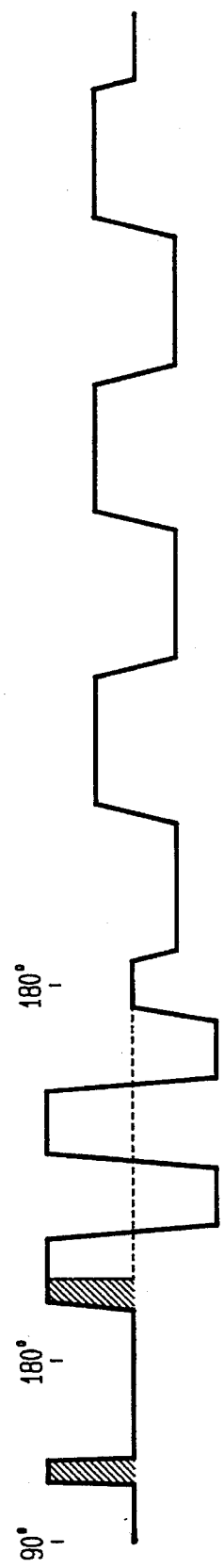

In FIG. 2E, there are multiple gradient refocussings between the initial 90° pulse and the first RF refocussing pulse. As shown, the gradient read time is longer after the first RF refocussing pulse. In FIG. 2F, there are three gradient refocussings after the first RF refocussing pulse and five gradient refocussings after the following RF refocussing pulses. The magnitude of the phase encoding gradient varies more greatly after the second RF refocussing pulse than after the first RF refocussing pulse.

The above pulse sequences will be repeated as many times as necessary to obtain the desired resolution. Such repetition is known to persons skilled in the art.

The above sequences may be categorized as per Table I below:

TABLE I

| | PDW Image Acquisition | | T2W Image Acquisition | |
| --- | --- | --- | --- | --- |
| FIG. | $N_{rf}$ | $N_{gr}$ | $N_{rf}$ | $N_{gr}$ |
| 2A | 1 | $\geq 2$ | $\geq 2$ | 1 |
| 2B | 1 | $\geq 2$ | $\geq 2$ | $\geq 2$ |
| 2C | $\geq 2$ | $\geq 2$ | $\geq 1$ | 1 |
| 2D | 0 | $\geq 2$ | $\geq 1$ | $\geq 2$ |
| 2E | 1 | $\geq 2$ | 1 | $\geq 2$ |

$N_{gr}$ = number of gradient refocussings in group between consecutive RF refocussing pulses
$N_{rf}$ = number of 180° RF refocussing pulses used during data acquisition for data type shown Although a preferred embodiment has been described above, the scope of the invention is limited only by the following claims:

We claim:

1. A method for acquiring a proton density weighted image and a $T_2$-weighted image during the same gradient spin-echo pulse sequence, comprising the steps of using a first total gradient read time during each of a series of echos while acquiring data for use in the proton density weighted image and using a second and different total gradient read time during each of a series of multiple echos while acquiring data for use in the $T_2$-weighted image.

2. The method of claim 1, wherein the total gradient read time between successive refocussing pulses during acquisition of data for use in the proton density weighted image is equal to the total gradient read time between successive refocussing pulses during acquisition of data for use in the $T_2$-weighted image.

3. The method of claim 1, wherein the total gradient read time between successive refocussing pulses during acquisition of data for use in the proton density weighted image is unequal to the total gradient read time between successive refocussing pulses during acquisition of data for use in the T$_2$-weighted image.

4. The method of claim 1, wherein the number of read-out gradients between sucessive refocussing pulses is constant during the pulse sequence.

5. The method of claim 1, wherein the number of read-out gradients between sucessive refocussing pulses is variable during the pulse sequence.

6. The method of claim 1, wherein the echos are caused by read-out gradients which alternate in polarity.

7. A method of conducting a magnetic resonance imaging study, comprising the step of using a gradient spin echo pulse sequence wherein the number of gradient refocussings following each refocussing pulse is varied during the pulse sequence.

8. A method for acquiring a proton density weighted image and a T$_2$-weighted image during the same pulse sequence, comprising the steps of using a first total gradient read time while acquiring data for use in the proton density weighted image and using a second and different total gradient read time while acquiring data for use in the T$_2$-weighted image, wherein the pulse sequence falls into one of the categories listed in the following table:

TABLE I

| Category | PDW Image Acquisition | | T2W Image Acquisition | |
|---|---|---|---|---|
| | $N_{rf}$ | $N_{gr}$ | $N_{rf}$ | $N_{gr}$ |
| 1 | 1 | $\geq 2$ | $\geq 2$ | 1 |
| 2 | 1 | $\geq 2$ | $\geq 2$ | $\geq 2$ |
| 3 | $\geq 2$ | $\geq 2$ | $\geq 1$ | 1 |
| 4 | 0 | $\geq 2$ | $\geq 1$ | $\geq 2$ |
| 5 | 1 | $\geq 2$ | 1 | $\geq 2$ |

$N_{gr}$ = number of gradient refocussings in group between consecutive RF refocussing pulses
$N_{rf}$ = number of 180° RF refocussing pulses used during data acquisition for data type shown.

\* \* \* \* \*